United States Patent
Kim et al.

(10) Patent No.: US 7,304,522 B2
(45) Date of Patent: Dec. 4, 2007

(54) SPREAD SPECTRUM CLOCK GENERATOR

(75) Inventors: Jong-hoon Kim, Daejon (KR); Pil-jung Jun, Suwon (KR); Jung-gun Byun, Suwon (KR); Dong-gun Kam, Daejon (KR); Joung-ho Kim, Daejon (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 664 days.

(21) Appl. No.: 10/372,265

(22) Filed: Feb. 25, 2003

(65) Prior Publication Data
US 2004/0095988 A1   May 20, 2004

(30) Foreign Application Priority Data
Nov. 15, 2002  (KR) .................. 10-2002-0071255

(51) Int. Cl.
*G06F 1/04*   (2006.01)

(52) U.S. Cl. ....................... 327/291; 327/293

(58) Field of Classification Search ........... 372/161, 372/164, 291, 293, 294; 375/130
See application file for complete search history.

(56) References Cited

U.S. PATENT DOCUMENTS

| | | | |
|---|---|---|---|
| 4,513,427 A | 4/1985 | Borriello et al. ............ 375/360 |
| 5,537,068 A | 7/1996 | Konno ....................... 327/115 |
| 5,731,728 A | 3/1998 | Greiss ........................ 327/299 |
| 6,144,242 A * | 11/2000 | Jeong et al. ................. 327/269 |
| 6,345,067 B1 * | 2/2002 | Okamoto ..................... 375/140 |
| 6,366,174 B1 * | 4/2002 | Berry et al. .................. 331/78 |
| 6,501,307 B1 * | 12/2002 | Yen ............................. 327/113 |
| 6,643,317 B1 * | 11/2003 | Blumer ....................... 375/130 |
| 6,687,319 B1 * | 2/2004 | Perino et al. ............... 375/367 |
| 6,919,744 B2 * | 7/2005 | Paist et al. .................. 327/115 |
| 7,010,014 B1 * | 3/2006 | Percey et al. ............... 375/130 |
| 7,061,293 B2 * | 6/2006 | Fukushima ................. 327/291 |

FOREIGN PATENT DOCUMENTS

| | | |
|---|---|---|
| JP | 2000-91911 | 3/2000 |
| JP | 2001-148690 | 5/2001 |
| JP | 2001-202153 | 7/2001 |
| JP | 2001-331236 | 11/2001 |
| KR | 2000-53958 | 9/2000 |

* cited by examiner

*Primary Examiner*—Kenneth B. Wells
*Assistant Examiner*—Hai L. Nguyen
(74) *Attorney, Agent, or Firm*—Staas & Halsey LLP

(57) ABSTRACT

A spread spectrum clock generator includes a plurality of delay cells, wherein each delay cell includes at least one delayer receiving an external clock signal and causing a predetermined propagation delay to the received clock signal, and a controller transmitting a control signal to the delayer to control the propagation delay of the delayer according to a state value of the control signal. With this configuration, the spread spectrum clock generator using a delayer can have a simple circuit configuration and effectively attenuate an EMI.

13 Claims, 12 Drawing Sheets

FIG. 7

| | q1 | q2 | q3 |
|---|---|---|---|
| THE STATE OF CONTROL SIGNAL | 0/1 | 0/1 | 0/1 |
| | FIRST DELAYER | SECOND DELAYER | THIRD DELAYER |
| THE DELAYED TIME OF DELAYER | 100/101 | 100/102 | 100/102 |

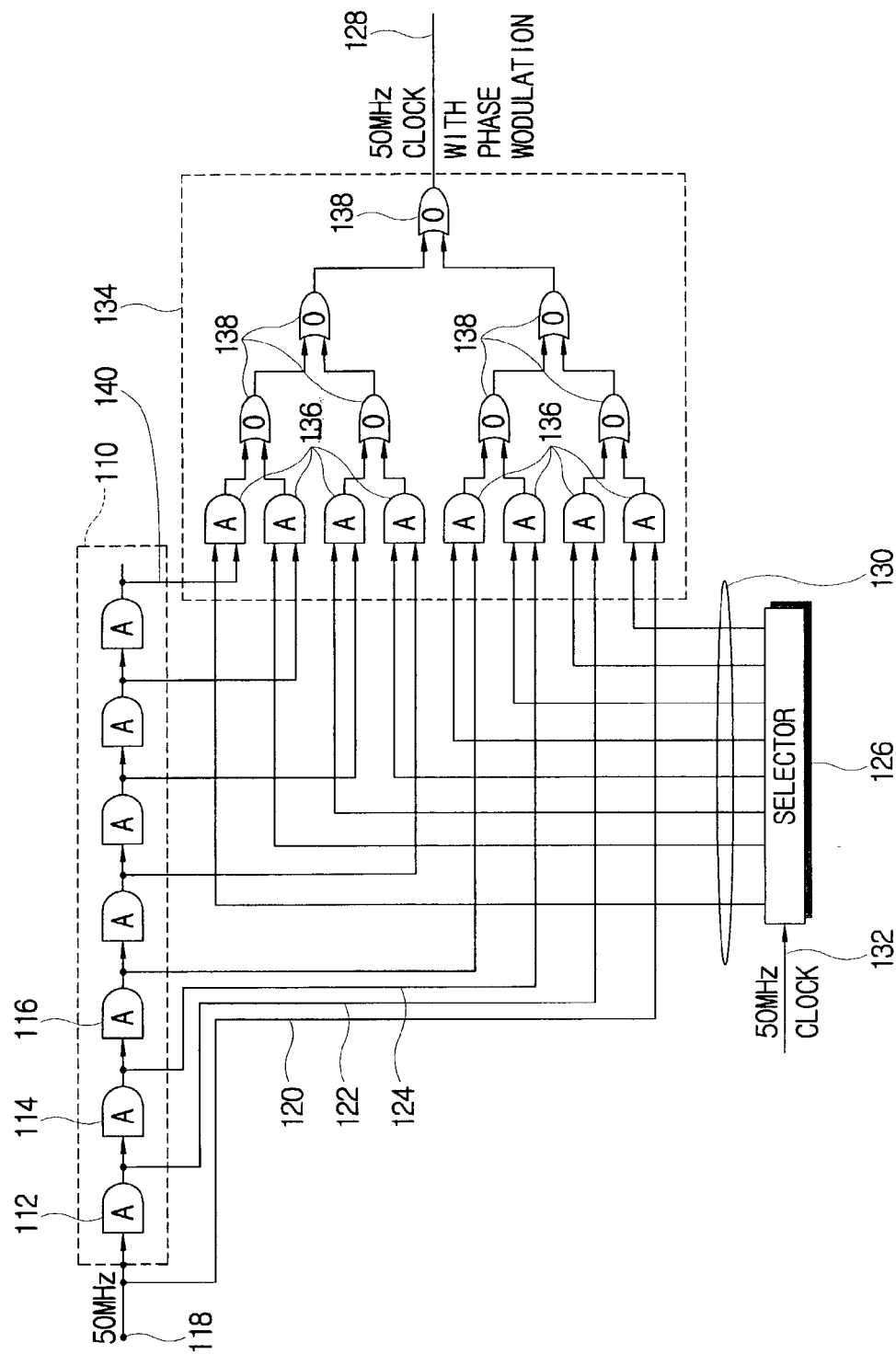

SPREAD SPECTRUM CLOCK GENERATOR

CROSS-REFERENCE TO RELATED APPLICATIONS

This application claims the benefit of Korean Patent Application No. 2002-71255, filed Nov. 15, 2002, in the Korean Intellectual Property Office, the disclosure of which is incorporated herein by reference.

BACKGROUND OF THE INVENTION

1. Field of the Invention

The present invention relates to a spread spectrum clock (SSC) generator, and more particularly, to a spread spectrum clock generator having a delayer.

2. Description of the Related Art

In a computer system, in order to improve system performance, it is possible that a central processing unit is operated at a higher clock frequency to increase a processing speed. However, the higher clock frequency makes the computer system and its peripheral devices (e.g., a memory card, a graphic card, etc.) be operated at a higher frequency and generate an amount of EMI (electromagnetic interference). Herein, the higher the clock frequency is increased, the more EMI is generated from the computer system and its peripheral devices. Therefore, to reduce the EMI, there have been proposed various techniques using shielding, filtering, etc., but it costs a great deal to follow and comply with EMI regulations, so that a method to fundamentally suppress the EMI is needed.

As the method to fundamentally suppress the EMI, there is a spread spectrum technique that modulates the clock frequency, thereby spreading over a wider range of bandwidth its energy concentrated on a narrow frequency band. Most of conventional spread spectrum clock generators are realized by using a PLL (phase locked loop) circuit. The PLL circuit receives an input signal and generates a clock signal having a desired frequency.

However, in the conventional spread spectrum clock generator using the PLL circuit, an attenuation degree of the EMI decreased according to an increment of the system clock frequency. Thus, the realization of the PLL circuit in the spread spectrum clock generators is very difficult at the higher clock frequency.

Accordingly, there has proposed a spread spectrum clock generator having a delayer, which has more effective suppression of the EMI.

As shown in FIG. 11, the conventional spread spectrum clock generator having the delayer includes a delay chain 110 including a plurality of AND gates 112, 114, 116 . . . , a selector 126 selecting one of channels inside the delay chain 110, and a multiplexer 134 including a plurality of AND gates 136 and a plurality of OR gates 138.

The delay chain 110 includes the AND gates 112, 114, 116 . . . connected in series, and therefore a propagation delay of each AND gate 112, 114, 116, . . . accumulates. Here, the respective AND gates are different from each other in the propagation delay, so that a total delay is determined according to the channels from an input terminal 118 of the AND gate 112, 114, 116 . . . to an output terminal 128. For example, no propagation delay is caused in a first channel 120, the propagation delay is caused in a second channel 122 by one AND gate 112, and another propagation delay is caused in a third channel 124 by two AND gates 112 and 114. At this time, a plurality of signals respectively entered through the AND gates 112, 114, 116, . . . are synthesized into a single signal, so that the AND gates 112, 114, 116 . . . are used as the delayer.

The selector 126 outputs one of selection signals 130 according to a predetermined pattern every time a clock signal 132 is inputted, thereby selecting one of the channels inside the delay chain 110.

The multiplexer 134 transmits a specific signal, which is outputted from the respective AND gates 112, 114, 116 . . . employed as the delayer 110 in response to the one of the selection signals 130 of the selector 126, to the output terminal 128. Here, the channels from the input terminal of the respective AND gates 112, 114, 116 . . . of the delay chain 110 to the output terminal 128 have the same distance, so that the total delay is determined according to what channel inside the delay chain 110 is selected.

With this configuration, in the conventional spread spectrum clock generator, the selector 126 outputs one of the selection signals 130 every time the clock signal 132 is inputted through the input terminal 118. Then, one of the AND gates 136 inside the multiplexer 134 is selected in response to the one of the selection signals 130 of the selector 126. Then, the clock signal 132 is transmitted from the delay chain 110 to the selected AND gate 136, and then transmitted to the output terminal 128 via the OR gates 138. At this time, during one period of the clock signal 132, other AND gates 136 are not operated except for the selected AND gate 136. Thereafter, at the following period of the clock signal, the selector 126 outputs another selection signal 130, and repeats the above process. As described above, the selector 126 is synchronized with the clock signal 132, that is, outputs one selection signal 130 in response to every clock signal, so that the output terminal 128 outputs a phase-modulated clock signal based on the original clock signal. Thus, the spread spectrum clock is realized.

In short, in the conventional spread spectrum clock generator using the delayer, the spread spectrum clock is realized by controlling the number of logic gates to be included in the channel. However, the conventional spread spectrum clock generator using the delayer cannot minutely control the total delay below an inherent propagation delay due to one logic gate. Generally, the propagation delay due to one inverter is 70~80 ps (picosecond), and the propagation delay due to one NAND gate is about 100 ps. Consequently, the conventional spread spectrum clock generator using the delayer cannot control the propagation delay of several tens or below ps. Further, the conventional spread spectrum clock generator using the delayer must include the selector and the multiplexer, thereby increasing a production cost.

SUMMARY OF THE INVENTION

Accordingly, it is an aspect of the present invention to provide a spread spectrum clock generator using a delayer, which can control a propagation delay of several tens or below ps by controlling an inherent propagation delay of a logic gate.

Additional aspects and advantages of the invention will be set forth in part in the description which follows and, in part, will be obvious form the description, or may be learned by practice of the invention.

The foregoing and/or other aspects of the present invention are achieved by providing a spread spectrum clock generator including a plurality of delay cells, wherein each delay cell includes at least one delayer receiving an external clock signal and causing a predetermined propagation delay to the received external clock signal, and a controller transmitting a control signal to the delayer to control the propagation delay of the delayer according to a state value of the control signal.

According to an aspect of the invention, the spread spectrum clock generator further includes a controller initializer transmitting a driving signal to one of a plurality of controllers.

According to an aspect of the invention, the spread spectrum clock generator further includes a clock generator transmitting a regular clock signal to one of a plurality of delayers.

According to an aspect of the invention, the delayers in the delay cells are connected in cascade, and the regular clock signal is inputted to the delayer of one delay cell placed on one side of the spread spectrum clock generator and transmitted to the delayer of a following delay cell.

According to an aspect of the invention, the controllers in the delay cells are connected in cascade, and the driving signal of the controller initializer is inputted to one controller controlling the delayer of one delay cell placed on the other side of the spread spectrum clock generator and transmitted to another controller controlling the delayer of another delay cell preceding the one delay cell.

According to an aspect of the invention, the delayer includes an inverter circuit inverting the external or regular clock signal, and having at least one pair of PMOS transistors and at least one pair of NMOS transistors, which are turned on or off by the control signal of the controller and causes another propagation delay to an output signal of the inverter circuit.

According to an aspect of the invention, the delayer includes an inverter circuit inverting the external or regular clock signal and having a transmission gate being turned on or off by the control signal of the controller and causing the another propagation delay to the output signal of the inverter circuit.

According to an aspect of the invention, a gate of the NMOS transistor has a lower width to length ratio (W/L) than a gate of the PMOS transistor.

According to an aspect of the invention, in the transmission gate, a gate of the NMOS transistor has a lower W/L than a gate of the PMOS transistor.

According to an aspect of the invention, a value of the W/L of the gate of each transistor is variable.

According to an aspect of the invention, the controller includes a latch circuit having a plurality of transistors and latching the control signal received from a former controller and transmitting the latched control signal to a latter controller.

According to an aspect of the invention, the latch circuit latches the control signal transmitted from the former controller or transmits the control signal from the former controller to the latter controller according to the state value of the output signal of the inverter circuit According to an aspect of the invention, the controller initializer includes a counter counting the number of times that the delayer of a last delay cell outputs a signal, and a T-flip flop reset by an external driving signal, enabled by a signal outputted from the counter, and outputting a toggle signal to initialize the controller of a last delay cell.

According to an aspect of the invention, the controller initializer includes an inverter inverting the control signal received from the controller of the delay cell including the delayer receiving the regular clock signal, and a buffer enabled by an external signal, receiving the output signal of the inverter, and initializing the controller of the last delay cell.

BRIEF DESCRIPTION OF THE DRAWINGS

These and/or other aspects and advantages of the present invention will become apparent and more readily appreciated from the following description of the embodiments, taken in conjunction with the accompany drawings of which:

FIG. 7 is a table exemplarily showing delayed times of delayers in response to controllers of FIG. 6;

FIG. 11 is a control block diagram of a conventional spread spectrum clock generator.

DETAILED DESCRIPTION OF THE PREFERRED EMBODIMENTS

Figure 1:
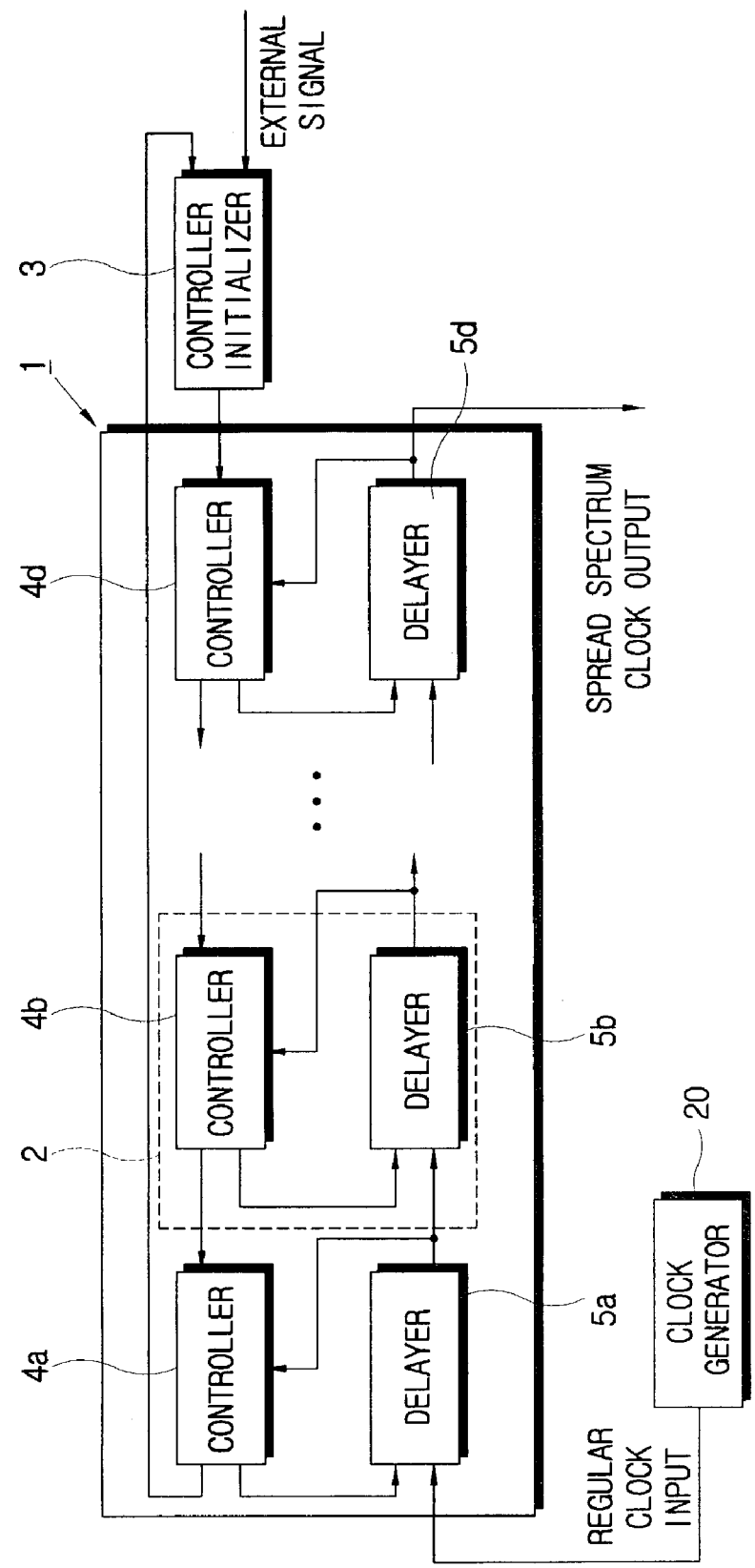
FIG. 1 is a block diagram of a spread spectrum clock generator according to an embodiment of the present invention.

Reference will now be made in detail to the embodiments of the present invention, examples of which are illustrated in the accompanying drawings, wherein like reference numerals refer to like elements throughout. The embodiments are described below in order to explain the present invention by referring to the figures.

Figure 2:
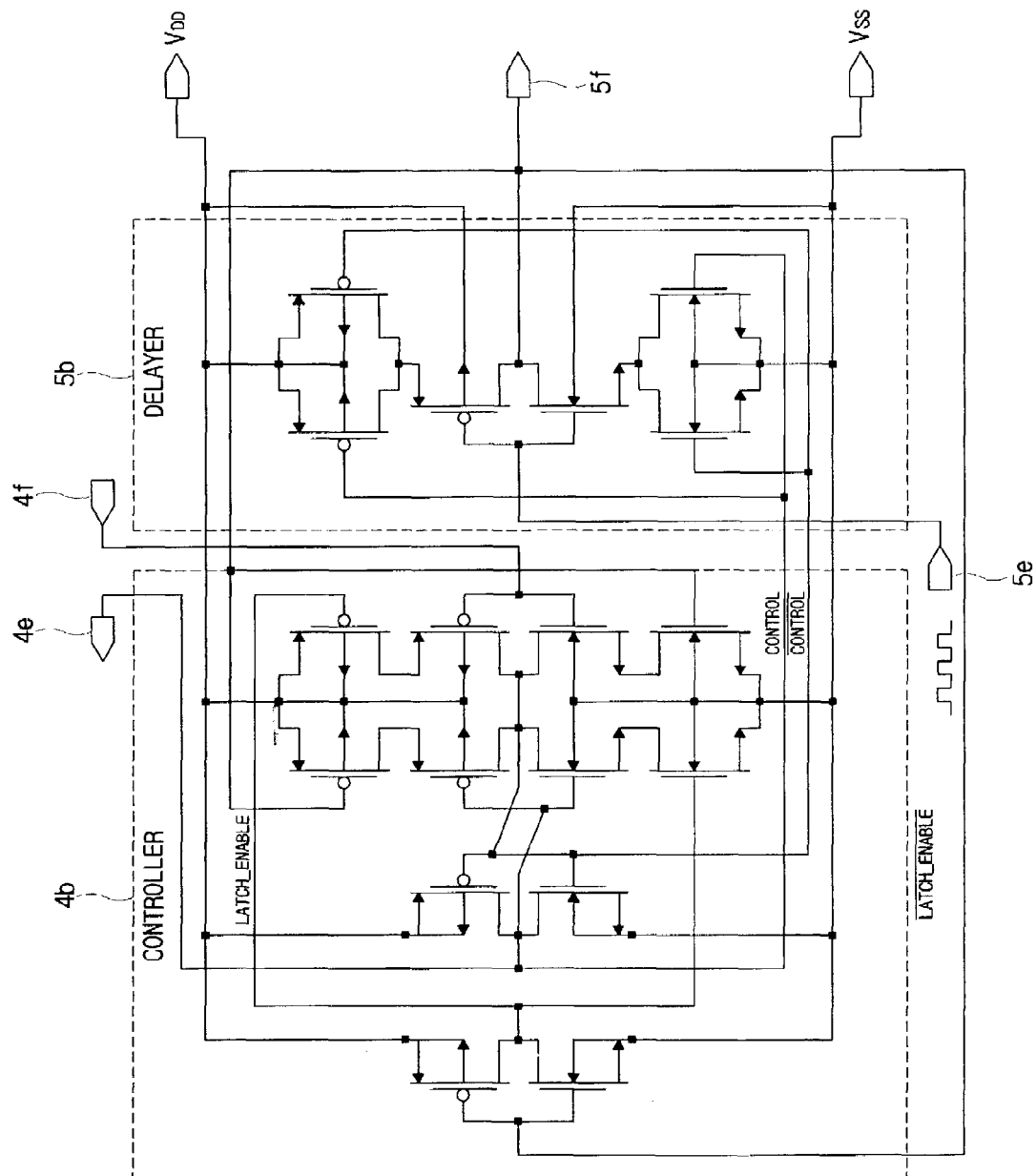
FIG. 2 is a circuit diagram of a controller and a delayer of the spread spectrum clock generator shown in FIG. 1.

FIG. 1 is a block diagram of a spread spectrum clock generator 1 using a delayer according to an embodiment of the present invention, and FIG. 2 is a circuit diagram of a controller and a delayer of the spread spectrum clock generator 1 shown in FIG. 1. As shown in FIG. 1, the spread spectrum clock generator 1 includes a plurality of delay cells 2 including controllers 4a, 4b, 4c, 4d and delayers 5a, 5b, 5c, 5d, a clock generator 20 transmitting a regular clock signal (input) to the delayer 5a, and a controller initializer 3 initializing the controller 4d.

The spread spectrum clock generator 1 receives the regular clock signal from the clock generator 20 and outputs a spread spectrum clock signal (output) via at least one delay cell 2.

The delay cells 2 are chained, in which the controllers 4a, 4b, 4c, 4d and the delayers 5a, 5b, 5c, 5d are connected in cascade, respectively. Thus, a driving signal is transmitted leftward from the controller 4d to the controller 4a, and the regular clock signal is transmitted rightward from the delayer 5a to the delayer 5d, so that the spread spectrum clock signal is outputted from the delayer 5d. Here, each delayer 5a, 5b, . . . , 5d outputs a delayed regular clock signal different in propagation delay according to whether a control signal outputted from each controller 4a, 4b, . . . , 4d is high or low.

As shown in FIG. 2, the controller 4b is realized using a latch circuit including a plurality of PMOS (positive-channel metal oxide semiconductor) transistors and a plurality of NMOS (negative-channel metal oxide semiconductor) transistors. The latch circuit includes a pair of inverter circuits, and two pairs of the PMOS transistors connected to two pairs of the NMOS transistors in series. Herein, the latch circuit is driven by a signal outputted from an inverter circuit 6 (refer to FIG. 3) of the delayer 5b (to be described later), and outputs the control signal to control the propagation delay of the delayer 5b.

The controller 4b includes a latter (left) controller connection pin 4e through which a signal is outputted to a latter (left) controller 4a, a former (right) controller connection pin 4f through which a signal is inputted from a former (right) controller 4d, and a pair of power pins Vdd and Vss through which electric power is supplied to the PMOS and NMOS transistors forming the controller 4b.

The delayer 5b includes an input pin 5e through which the regular clock signal is inputted, and an output pin 5f through which the delayed regular clock signal is outputted.

Thus, a signal inverted from the regular clock signal by the inverter circuit 6 of the delayer 5b is fed back to the controller 4b, thereby being used as an enable (feedback) signal LATCH-ENABLE for the latch circuit. Then, the controller 4b is driven by the feedback signal from the delayer 5b, and outputs a latching signal to the latter (left) controller 4a or remains in a latched state.

Figure 3:
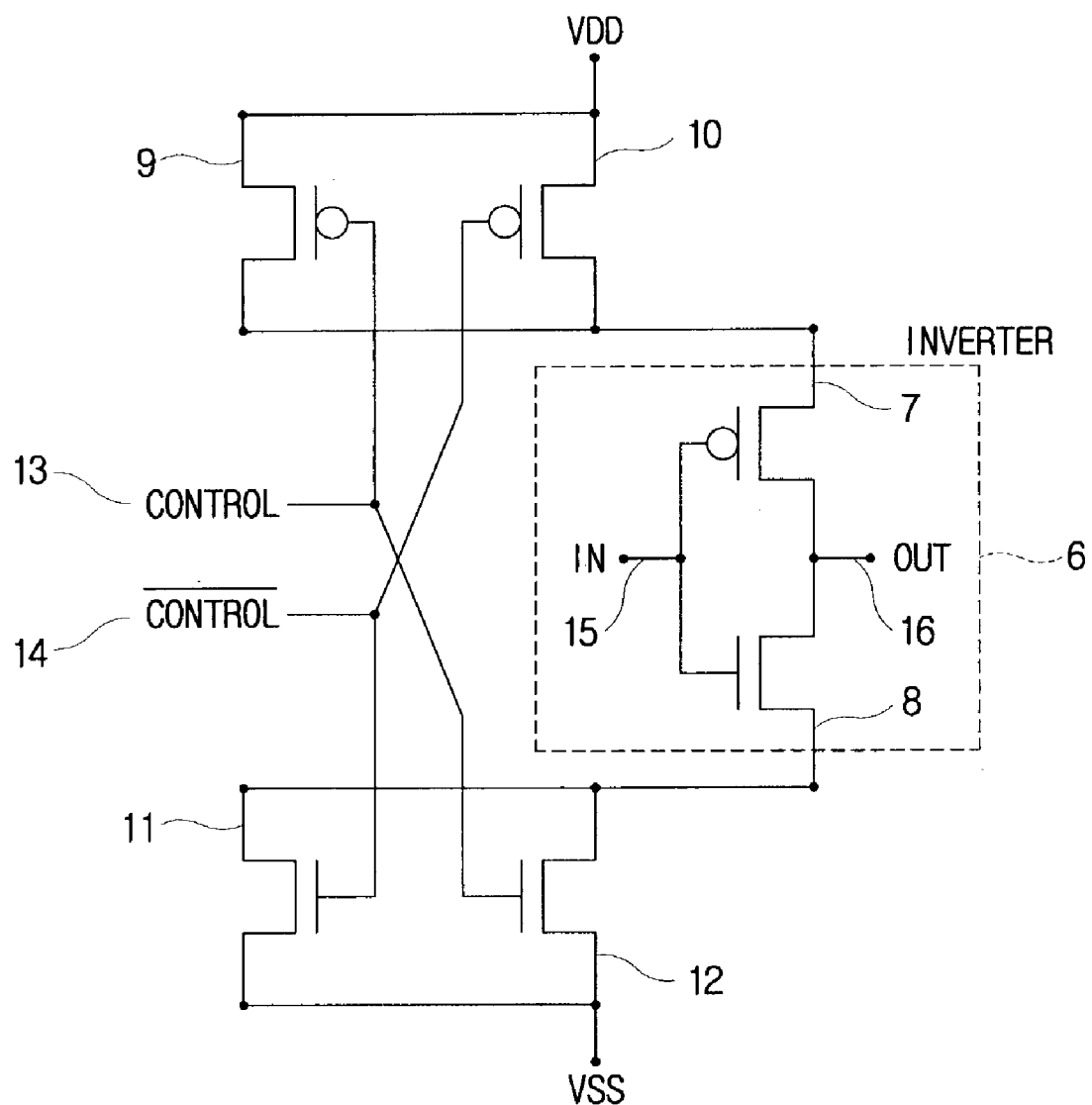
FIG. 3 is a circuit diagram of the delayer shown in FIGS. 1 and 2.

FIG. 3 is a circuit diagram of the delayer 5b of FIG. 1. As shown in FIG. 3, the delayer 5b controls the propagation delay using the inverter circuit 6 having one PMOS transistor 7 and one NMOS transistor 8. The PMOS transistor 7 and the NMOS transistor 8 of the inverter circuit 6 are driven by two pairs of PMOS transistors 9 and 10 and two pairs of NMOS transistors 11 and 12, respectively, which are connected to the inverter circuit 6. Herein, the PMOS and NMOS transistors 9 and 12 are operated by a control signal 13 outputted from the controller 4b, and the PMOS and NMOS transistors 10 and 11 are operated by an inverted control signal 14 outputted from the controller 4b, wherein the control signals 13 and 14 respectively alternate 0 and 1 in inverse relation to each other.

It is possible that the PMOS transistors 9 and 10 connected to the inverter circuit 6 are designed to be different from each other in a ratio of a width to a length (hereinbelow referred to as "W/L") of their gates. Further, it is possible that the two NMOS transistors 11 and 12 connected to the inverter circuit 6 are also designed to be different from each other in the W/L of their gates. Further, it is possible that the gate of the NMOS transistor has a lower W/L than the gate of the PMOS transistor, so that the propagation delay varies according to whether the control signal of the controller 4b is high or low. For instance, in a case that the gates of the PMOS and NMOS transistors 9, 10, 11 and 12 have the W/L values of 100, 10, 50 and 5, respectively, the propagation delay due to the PMOS transistor 9 and the NMOS transistor 11 is shorter than that due to the PMOS transistor 10 and the NMOS transistor 12, thereby allowing a total delay to be minutely controlled.

Figure 4:
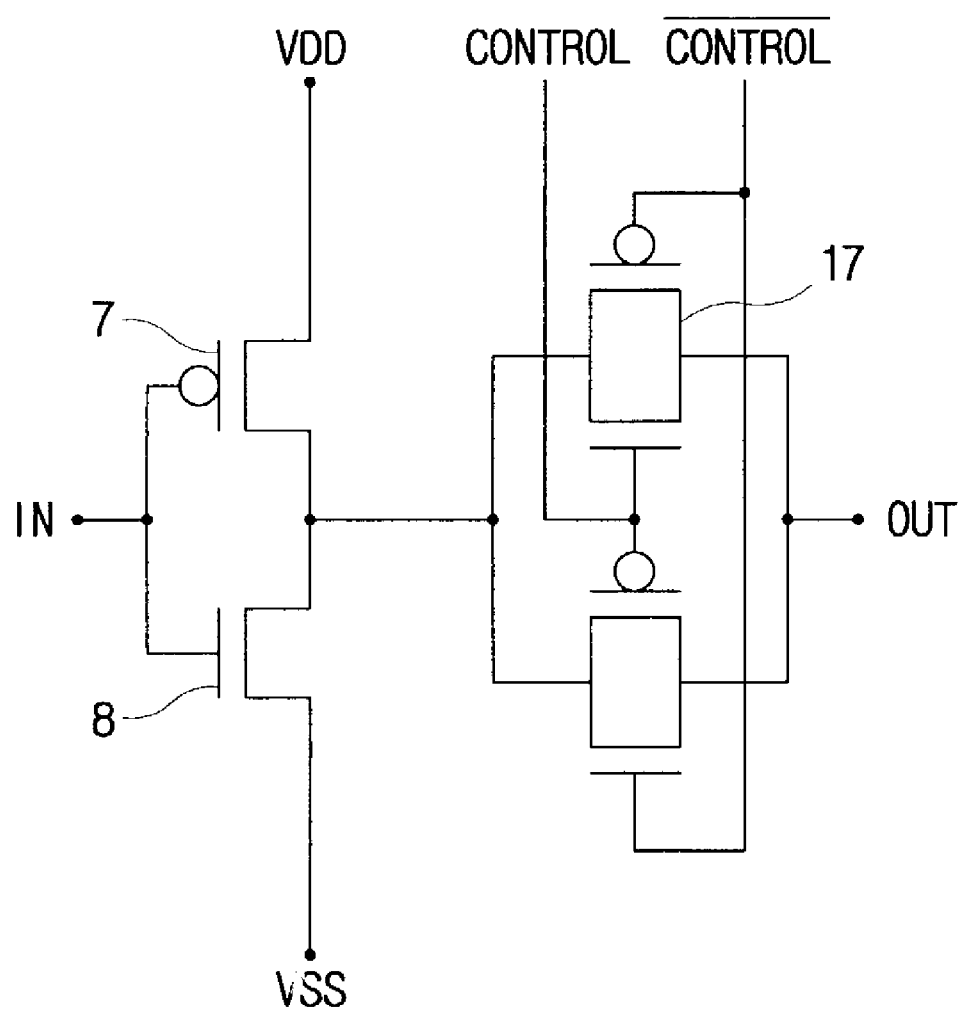
FIG. 4 is a circuit diagram of another delayer of the spread spectrum clock generator shown in FIG. 1.

FIG. 4 is a circuit diagram of another delayer of the spread spectrum clock generator shown in FIG. 1. As shown in FIG. 4, instead of the transistors 9, 10, 11 and 12 of FIG. 3, a transmission gate 17 is used for controlling the propagation delay of the inverter circuit 6. In the transmission gate 17, it is possible that the gate of the NMOS transistor has a lower W/L than the gate of the PMOS transistor, thereby controlling the propagation delay different according to whether the control signal of the controller 4b is high or low.

Figure 5A:
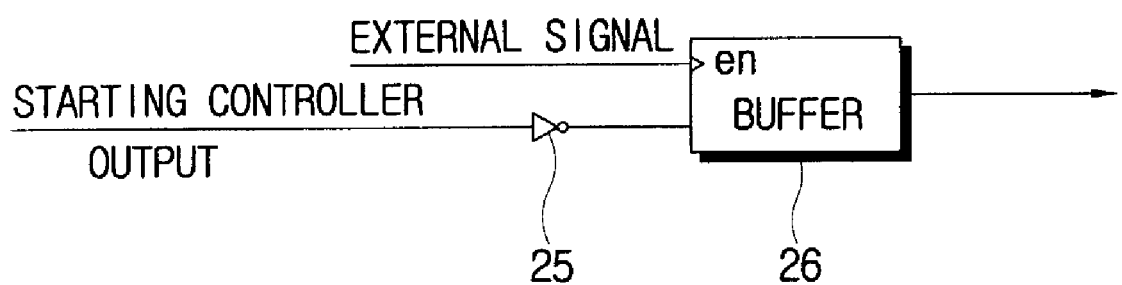
FIGS. 5A and 5B are block diagrams exemplarily illustrating a controller initializer of the spread spectrum clock generator shown in FIG. 1.
Figure 5B:
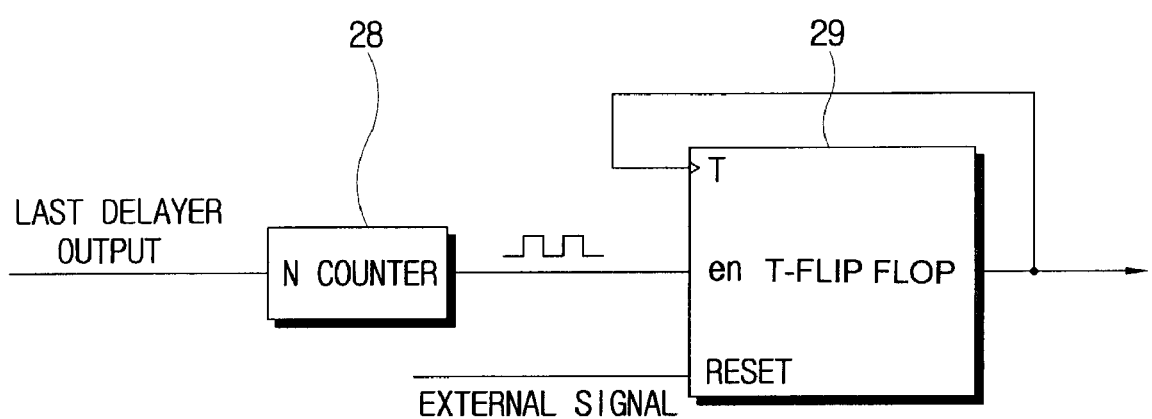

FIGS. 5A and 5B exemplarily illustrate diagrams of the controller intializer of the spread spectrum clock generator shown in FIG. 1. As shown in FIG. 5A, the controller initializer 3 includes an inverter 25 inverting the control signal received from the starting controller 4a, and a buffer 26 enabled by an external signal and outputting the inverted control signal. This controller initializer 3 including the buffer 26 may be used when the number of the delay cells 2 is relatively small or when a period of the regular clock signal is relatively long.

Further, as shown in FIG. 5B, the controller initializer 3 includes an N counter 28 counting the number of times that the last delayer 5d outputs a signal, and a T-flip flop 29 enabled by a signal outputted from the N counter 28 and outputting a toggle signal. Here, it is possible that "N" of the N counter 28 is half the number of the delay cells 2.

Figure 6:
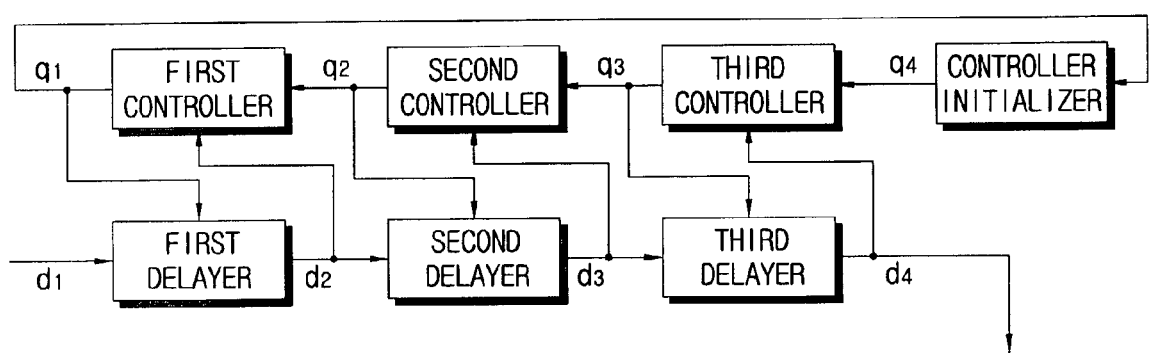
FIG. 6 is a block diagram of another spread spectrum clock generator having three delay cells according to another embodiment of the present invention.
Figure 8:
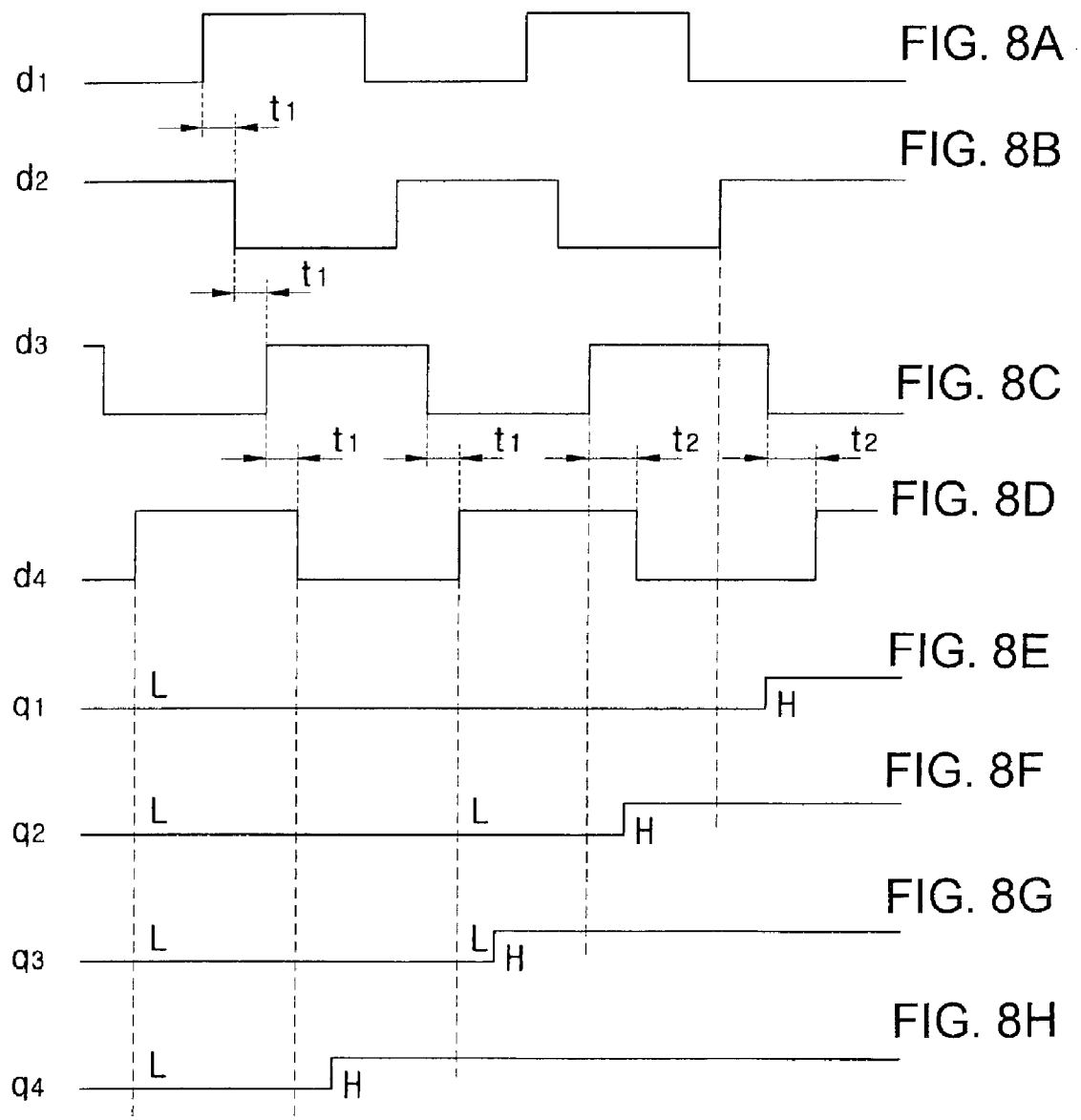
FIGS. 8A through 8H illustrate output signals of the controllers and the delayers of FIG. 6.

FIG. 6 is a block diagram of the spread spectrum clock generator having three delayers according to another embodiment of the present invention, and FIG. 7 is a table exemplarily showing delayed times of the delayers in response to the controllers of FIG. 6. As shown in FIGS. 6 and 7, three delay cells 2 are chained, so that first through third controllers are connected in cascade, and first through third delayers are also connected in cascade.

When the controller initializer 3 outputs the driving signal q4 to the third controller, the driving signal q4 is transmitted to the first controller via the second controller, thereby driving every controller. Then, the delayer outputs a predetermined delayed clock signal d1, d2, d3, d4 to the following delayer in response to the control signal q1, q2, q3 outputted from the corresponding controller. Here, the delayed time due to the delayer is determined according to the state value of the control signal of the corresponding controller.

As shown in table 20 of FIG. 7, when the state value of the control signal is 0, the delayed times due to the first through third delayers are 100, 100 and 100, respectively. When the state value of the control signal is 1, the delayed times due to the first through third delayers are 101, 102 and 102, respectively. However, the delayed time determined according to the state value of the control signal may be changed by adjusting the W/L values of the gates of the PMOS and NMOS transistors provided in the delayer shown in FIG. 3.

FIGS. 8A through 8H illustrate output signals of the controllers and the delayers of FIG. 6. As shown FIGS. 8A through 8H, the regular clock signal d1 is inputted to the first delayer and passes through the first, second and third delayers, thereby being outputted as delayed and inverted clock signals d2, d3, d4. For instance, the delayed time of the clock signal outputted from the third delayer depends on the delayed time 100 or 102 due to the third delayer, which is determined according to whether the state value of the control signal q3 of the third controller is low 0 or high 1. That is, when the state value of the control signal q3 of the third controller is low, for example, 0, the PMOS and NMOS transistors 9 and 11 provided in the inverter circuit 6 (refer to FIG. 3) of the third delayer are turned on, thereby causing the delayed time t1 of 100 by the W/L value of the PMOS and NMOS transistors 9 and 11. Oppositely, when the state value of the control signal q3 of the third controller is high, for example, 1, the PMOS and NMOS transistors 10 and 12 provided in the inverter circuit 6 (refer to FIG. 3) of the third delayer are turned on, thereby causing the delayed time t2 of 102 by the W/L value of the PMOS and NMOS transistors 10 and 12.

Figure 9:
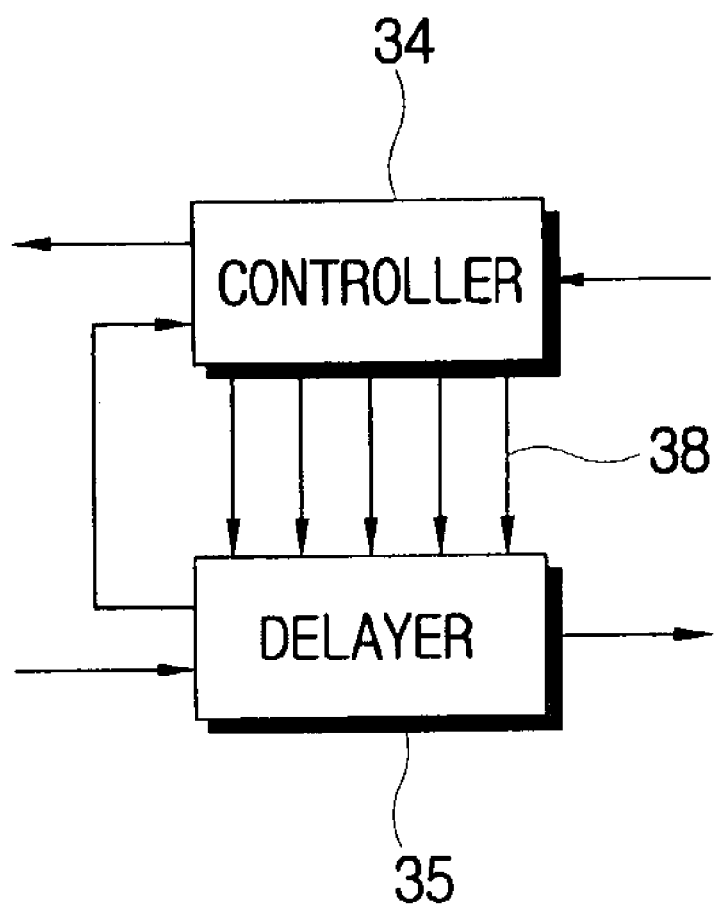
FIG. 9 is a block diagram of another spread spectrum clock generator according to another embodiment of the present invention.

FIG. 9 is a block diagram of another spread spectrum clock generator according to another embodiment of the present invention. As shown FIGS. 1, 3, and 9, in the spread spectrum clock generator, the delay cell includes a controller 34, and a delayer 35 connected to the controller 34 with a plurality of control signal lines 38 and having a plurality of delay circuits (not shown) operated by a control signal transmitted through the control signal lines 38 from the controller 34. Herein, the delayer 35 includes a plurality of cells driving the inverter circuit 6 connected with a plurality of PMOS and NMOS transistors forming pairs. Further, at least two control signals are outputted from the controller 34. In this case, the number of delay cells can be decreased, thereby decreasing a size of the spread spectrum clock generator.

Figure 10:
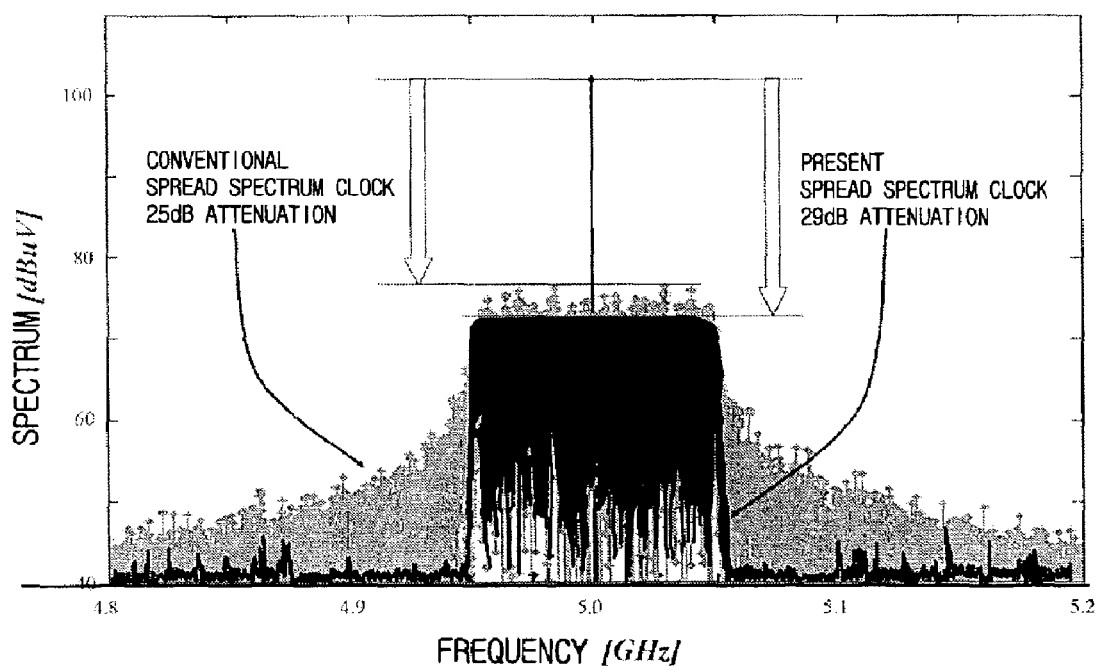
FIG. 10 illustrates a distribution of a spectrum corresponding to a frequency generated from the spread spectrum clock generator shown in FIG. 1.

FIG. 10 illustrates a distribution of a spectrum corresponding to a frequency from the spread spectrum clock generator on the assumption that a frequency of the regular or fundamental clock signal is 5 GHz. As shown in FIG. 10, the spectrum is symmetrically distributed with respect to the fundamental clock signal frequency of 5 GHz. According to the distribution, a maximum spectrum can be reduced about 25 dB (decibel) by the conventional spread spectrum clock generator and can be reduced about 29 dB by the spread spectrum clock generator 1 according to the present invention. In other words, the spread spectrum clock generator 1 can reduce 4 dB more than that of the conventional spread spectrum clock generator.

With this configuration, the conventional spread spectrum clock generator using the delayer controls the total delay by settling the number of logic gates, whereas the spread spectrum clock generator using the delayer according to the present invention controls the total delay by adjusting the W/L values of the gates of the PMOS and NMOS transistors, i.e., controls the inherent propagation delay of the logic gate. Hence, the conventional spread spectrum clock generator using the delayer can control only the inherent propagation delay due to one logic gate, i.e., cannot control the propagation delay of several tens or below ps, whereas the spread spectrum clock generator using the delayer according to the present invention can minutely control the total delay below the inherent propagation delay due to one logic gate, thereby reducing EMI effectively. Further, the spread spectrum clock generator using the delayer according to the present invention does not include a selector and a multiplexer used in the conventional spread spectrum clock generator, so that its configuration is simplified, thereby decreasing a production cost.

As described above, the present invention provides a spread spectrum clock generator using a delayer, which can have a simple circuit configuration and control a propagation delay of several tens or below ps.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A spread spectrum clock generator comprising:
   a plurality of delay cells, wherein each delay cell includes
   at least one delayer receiving an external regular clock signal and causing a predetermined propagation delay to the received regular clock signal to generate a delayed clock signal, and a controller transmitting a control signal to the delayer to control the propagation delay of the delayer according to a state value of the control signal;
   wherein:
   the delay cells comprise,
   a first delay cell having a first delayer and a first controller controlling the first delayer to generate the delayed clock signal, and
   a last delay cell having a last delayer and a last controller controlling the last delayer to generate a last delayed clock signal in response to the delayed clock signal, and
   the generator further comprises:
   a controller initializer transmitting a driving signal to the last controller of the last delay cell to generate the control signal.

2. The spread spectrum clock generator according to claim 1, further comprising:
   a clock generator transmitting the external regular clock signal to the first delayer of the first delay cell.

3. The spread spectrum clock generator according to claim 2, wherein the delay cells comprise a plurality of intermediate middle delayers connected in cascade between the first delayer and the last delayer, and the regular clock signal is inputted to the first delayer of the first delay cell and transmitted to one of the intermediate delayers.

4. The spread spectrum clock generator according to claim 3, wherein the delay cells comprise a plurality of intermediate controllers connected in cascade between the first controller and the last controller, and the driving signal of the controller initializer is inputted to the last controller and transmitted to one of the intermediate controllers.

5. The spread spectrum clock generator according to claim 4, wherein the controller initializer comprises:
   a counter counting the number of times that the last delayer of the last delay cell outputs the delayed clock signal; and
   a T-flip flop reset by the driving signal, enabled by a signal outputted from the counter, and outputting a toggle signal to initialize the last controller of the last delay cell.

6. The spread spectrum clock generator according to claim 4, wherein the controller initializer comprises:
   an inverter inverting the control signal received from the first controller of the first delay cell including the first delayer receiving the regular clock signal, and generating an output signal; and
   a buffer enabled by an external signal, receiving the output signal of the inverter, and initializing the last controller of the last delay cell.

7. The spread spectrum clock generator according to claim 4, wherein the delayer comprises:
   an inverter circuit inverting the clock signal; and
   a transmission gate being turned on or off by the control signal of the corresponding controller and causing the propagation delay to an output signal of the inverter circuit.

8. The spread spectrum clock generator according to claim 7, wherein the transmission gate comprises:
   an NMOS transistor having a first width to length ratio; and
   a PMOS transistor having a second width to length ratio greater than the first width to length ratio.

9. The spread spectrum clock generator according to claim 4, wherein the delayer comprises:
   an inverter circuit inverting the clock signal; and at least one pair of PMOS transistors and at least one pair of NMOS transistors, which are turned on or off by the control signal of the corresponding controller and causes the propagation delay to an output signal of the inverter circuit.

10. The spread spectrum clock generator according to claim 9, wherein the NMOS transistors comprise:

a gate having a width to length ratio lower than that of the PMOS transistor.

11. The spread spectrum clock generator according to claim 10, wherein the width to length ratio of the gate is variable.

12. The spread spectrum clock generator according to claim 9, wherein one of the intermediate controllers comprises:

a latch circuit having a plurality of transistors and latching the control signal received from the last controller and transmitting the latched control signal to another one of the intermediate controllers.

13. The spread spectrum clock generator according to claim 12, wherein the latch circuit latches the control signal transmitted from the one of the intermediate controllers or transmits the control signal from the one of the intermediate controllers to another one of the intermediate controllers connected to the one of the intermediate controllers according to a state value of the output signal of the inverter circuit of the delayer.

* * * * *